(12) United States Patent
Yang et al.

(10) Patent No.: US 10,497,576 B1
(45) Date of Patent: Dec. 3, 2019

(54) DEVICES WITH SLOTTED ACTIVE REGIONS

(71) Applicant: GLOBALFOUNDRIES INC., Grand Cayman (KY)

(72) Inventors: Heng Yang, Rexford, NY (US); David C. Pritchard, Glenville, NY (US); George J. Kluth, Saratoga Springs, NY (US); Anurag Mittal, San Jose, CA (US); Hongru Ren, Mechanicville, NY (US); Manjunatha G. Prabhu, Clifton Park, NY (US); Kai Sun, Clifton Park, NY (US); Neha Nayyar, Clifton Park, NY (US); Lixia Lei, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/105,388

(22) Filed: Aug. 20, 2018

(51) Int. Cl.
| | |
|---|---|
| *H01L 21/84* | (2006.01) |
| *H01L 21/308* | (2006.01) |
| *H01L 29/66* | (2006.01) |
| *H01L 27/12* | (2006.01) |
| *H01L 29/78* | (2006.01) |
| *H01L 21/311* | (2006.01) |
| *H01L 21/02* | (2006.01) |

(52) U.S. Cl.
CPC ...... *H01L 21/3088* (2013.01); *H01L 21/3081* (2013.01); *H01L 21/3086* (2013.01); *H01L 21/84* (2013.01); *H01L 27/1203* (2013.01); *H01L 29/6656* (2013.01); *H01L 21/02271* (2013.01); *H01L 21/31116* (2013.01); *H01L 29/7849* (2013.01)

(58) Field of Classification Search
None
See application file for complete search history.

(56) References Cited

U.S. PATENT DOCUMENTS

| | | | |
|---|---|---|---|
| 7,763,531 | B2 | 7/2010 | Abadeer et al. |
| 9,379,212 | B1 * | 6/2016 | Zhang ............... H01L 21/28114 |
| 2007/0122986 | A1 * | 5/2007 | Sandhu ................. B82Y 10/00 438/301 |
| 2015/0069466 | A1 * | 3/2015 | Chang ............... H01L 21/30608 257/192 |
| 2017/0170317 | A1 * | 6/2017 | Sichler ................ H01L 29/0649 |

OTHER PUBLICATIONS

DeSalvo et al., "A mobility enhancement strategy for sub-14nm power-efficient FDSOI technologies", Conference IEEE, Electron Devices Meeting (IEDM), Feb. 23, 2014, 4 pages.

* cited by examiner

*Primary Examiner* — Bilkis Jahan
(74) *Attorney, Agent, or Firm* — David Cain; Andrew M. Calderon; Roberts Mlotkowski Safran Cole & Calderon, P.C.

(57) ABSTRACT

The present disclosure relates to semiconductor structures and, more particularly, to devices with slotted active regions and methods of manufacture. The method includes: forming a mandrel on top of a diffusion region comprising a diffusion material; forming a first material over the mandrel and the diffusion region; removing the mandrel to form multiple spacers each having a thickness; depositing a second material over the spacers and the diffusion material; and forming slots in the diffusion region by removing a portion of the second material over the diffusion region and the underlying diffusion material.

11 Claims, 4 Drawing Sheets

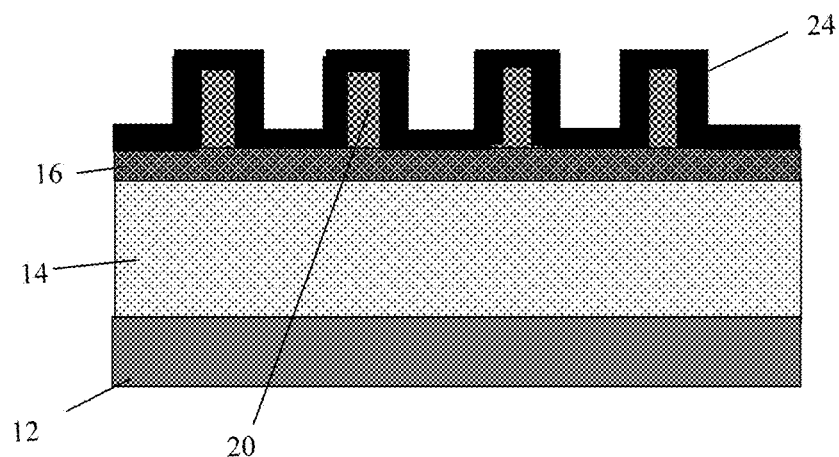
FIG. 4
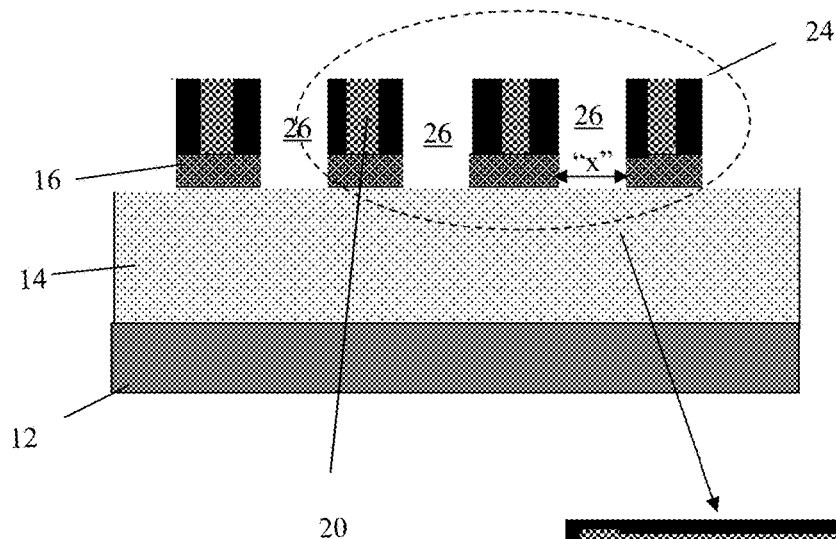
FIG. 5
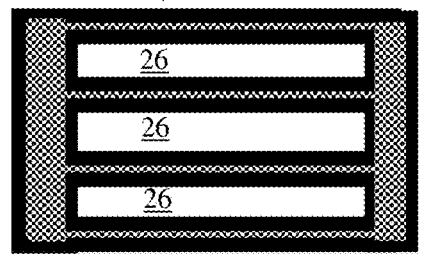

DEVICES WITH SLOTTED ACTIVE REGIONS

FIELD OF THE INVENTION

The present disclosure relates to semiconductor structures and, more particularly, to devices with slotted active regions and methods of manufacture.

BACKGROUND

CMOS improvement has been achieved through strain engineering for mobility enhancement. For example, placing a strain in the channel region has been an effective approach to CMOS enhancement. This has been achieved by the deposition of a strain material near the channel of the device, e.g., material that would provide a tensile stress for NFET and a compressive stress for PFET.

However, as pitch continues to be scaled, strain materials are becoming less effective. For example, it has been found that fully-depleted-silicon-on-insulator (FDSOI) PFETs suffer low-mobility caused by strain relaxation at active/diffusion edges.

SUMMARY

In an aspect of the disclosure, a method comprises: forming a mandrel on top of a diffusion region comprising a diffusion material; forming a first material over the mandrel and the diffusion region; removing the mandrel to form multiple spacers each having a thickness; depositing a second material over the spacers and the diffusion material; and forming slots in the diffusion region by removing a portion of the second material over the diffusion region and the underlying diffusion material.

In an aspect of the disclosure, a method comprises: blanket depositing of a first material on an active region of a fully depleted substrate; patterning the first material to form a mandrel; forming spacers on sidewalls of the mandrel; removing the mandrel by a maskless etching process; adjusting a width of the spacers by deposition of material on the sidewalls of the spacers; and patterning the active region using the spacers and material as a mask.

In an aspect of the disclosure, a structure comprises a fully depleted semiconductor on insulator device having a slotted active region, wherein the active region has an active area ratio between the active area and slots within the active region of about 80%.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 4 shows a deposition of material on the spacers and respective fabrication processes in accordance with aspects of the present disclosure.

FIG. 5 shows slots formed in the active region and respective fabrication processes in accordance with aspects of the present disclosure.

DETAILED DESCRIPTION

The present disclosure relates to semiconductor structures and, more particularly, to devices with slotted active regions and methods of manufacture. More specifically, in embodiments, the devices with slotted active regions include an active region that is sliced into multiple smaller regions resulting in a multi-stripe active region, preferably implemented in fully depleted semiconductor on insulator (FDSOI) structures. Advantageously, slicing the active region along the channel-length direction to multiple smaller stripes will effectively decrease uniaxial stress along the gate which, in turn, increases the hole mobility.

In more specific embodiments, the present disclosure describes several innovative processes, including a Self-Aligned increased-Spacer Quadruple Patterning (SAiQP) process used to manufacture a multi-stripe active region FDSOI structure. The processes described herein, e.g., SAiQP, can achieve a higher number of stripes to increase hole mobility, while minimizing loss of effective active/diffusion area. For example, instead of direct etching used in conventional processes (e.g., which results in a space >>25 nm), the SAiQP process can make stripe-space less than 10 nm. The smaller stripe space will maximize the source/drain region efficiency by maintaining an effective active area while maximizing the number of slices. Also, in embodiments, the optimized slice width and smaller space make the slotted active region possible for logic/SRAM design using FDSOI technology.

The slotted device structures of the present disclosure can be manufactured in a number of ways using a number of different tools. In general, though, the methodologies and tools are used to form structures with dimensions in the micrometer and nanometer scale. The methodologies, i.e., technologies, employed to manufacture the slotted device structures of the present disclosure have been adopted from integrated circuit (IC) technology. For example, the structures are built on wafers and are realized in films of material patterned by photolithographic processes on the top of a wafer. In particular, the fabrication of the slotted device structures uses three basic building blocks: (i) deposition of thin films of material on a substrate, (ii) applying a patterned mask on top of the films by photolithographic imaging, and (iii) etching the films selectively to the mask.

Figure 1:
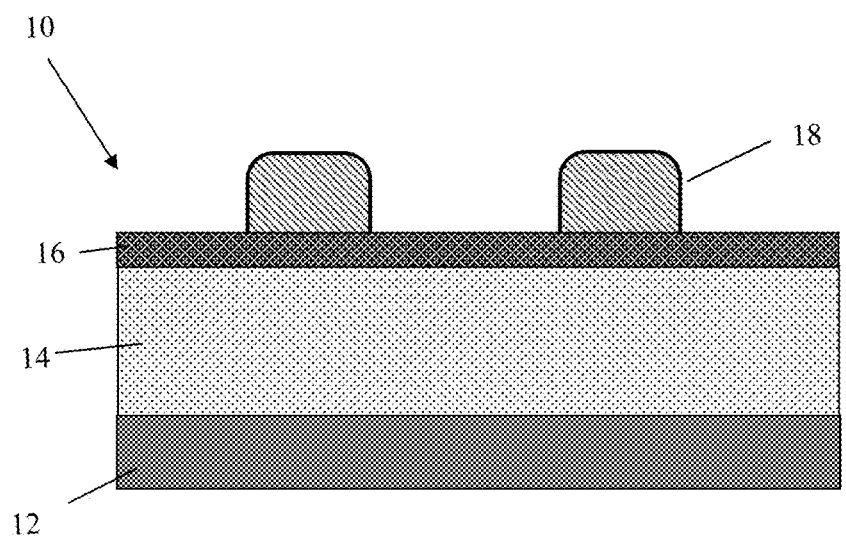
FIG. 1 shows a mandrel structure and respective fabrication processes in accordance with aspects of the present disclosure.

FIG. 1 shows a mandrel structure and respective fabrication processes in accordance with aspects of the present disclosure. In particular, the structure 10 includes an insulator layer 14 on a substrate 12. A semiconductor material 16 is on the insulator layer 14. In embodiments, the semiconductor material 16 can be a fully depleted semiconductor on insulator material (FDSOI) composed of any suitable semiconductor material including, but not limited to, Si, SiGe, SiGeC, SiC, GaAs, InAs, InP, and other III/V or II/VI compound semiconductors. The insulator layer 14 can be a buried oxide (BOX) material. In addition, the semiconductor material 16 includes an active area for gate structures, e.g., source/drain diffusions A plurality of mandrels 18 is formed on the semiconductor material 16, e.g., over active diffusion regions. In embodiments, the mandrels 18 can be composed of a nitride material deposited using conventional deposition methods followed by a patterning process. For example, the nitride can be deposited by a blanket chemical vapor deposition (CVD) process, followed by a reactive ion etching process. In embodiments, the mandrel pitch can be about 336 nm (e.g., width of about 118 nm and a spacing between adjacent mandrels of about 218 nm). In an alternative embodiment, the mandrel pitch can be about 82 nm (e.g., width of about 30 nm and a spacing between adjacent mandrels of about 52 nm). It is also contemplated that other pitches can be used in accordance with aspects of the present disclosure.

Figure 2:
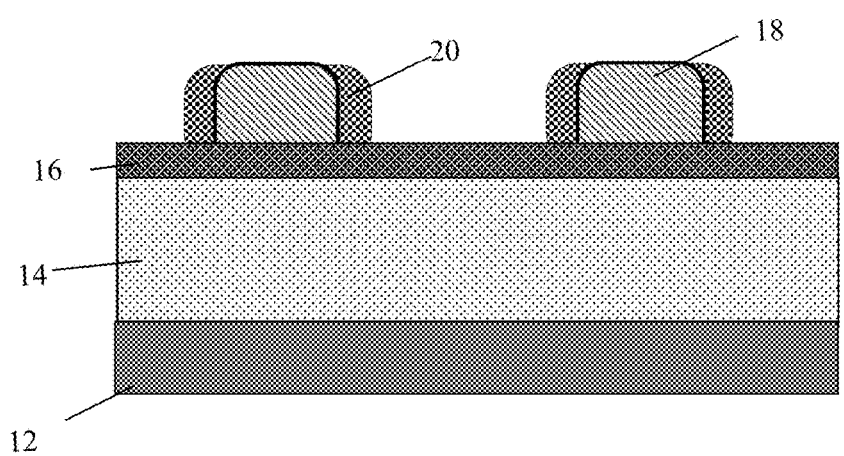
FIG. 2 shows spacers on sidewalls of the mandrel structure and respective fabrication processes in accordance with aspects of the present disclosure.

In FIG. 2, a spacer (sidewall) 20 is formed on the semiconductor material 16. In embodiments, the spacer material is an oxide material or other material that will have an etch selectivity to both the mandrel 18 and the semiconductor material 16. The spacers 20 can be deposited over the mandrels 18 and semiconductor material 16 using a conventional deposition process, e.g., CVD, followed by an anisotropic etching process to remove spacer material from all horizontal surfaces, e.g., above the mandrels 18 and the surface of the semiconductor material 16. In embodiments, the width of the spacers 20 can be about 50 nm with a mandrel pitch of 336 nm. Alternatively, the width of the spacers 20 can be about 11 nm with a mandrel pitch of 82 nm. It is also contemplated that other widths can be used in accordance with aspects of the present disclosure, depending on the mandrel pitch.

Figure 3:
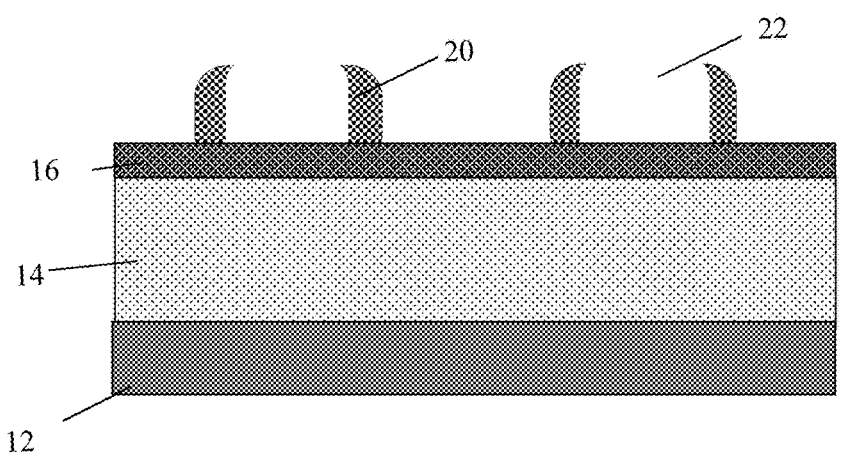
FIG. 3 shows removal of the mandrel structure and respective fabrication processes in accordance with aspects of the present disclosure.

As shown in FIG. 3, the mandrels are removed, which will form a space 22 between the spacers 20. In embodiments, the mandrels can be removed by a maskless process due to the etching selectivity between the materials of the mandrels and the spacers 20.

In FIG. 4, the width of the spacers 20 are adjusted by a blanket deposition of material 24 over the spacers 20. Adjusting the width of the spacers 20, e.g., making them wider, will effectively reduce the space between adjacent spacers for subsequent etching processes of the active region. In embodiments, the material 24 is a same material as the spacers 20. For example, the material 24 can be an oxide material, which is used to adjust the spacing between adjacent spacers 20. The material 24 can be deposited using a conventional blanket deposition process, e.g., CVD. The spacers 20 and material are both preserved for the final source/drain contact space.

FIG. 5 shows patterning of the active regions, e.g., semiconductor material 16, to form slots 26 in the active region and respective fabrication processes in accordance with aspects of the present disclosure. First, as shown in FIG. 5, material 24 on horizontal surfaces of the spacers 20 and the surface of the semiconductor material 16 is removed by an anisotropic etching process. This process will leave material on the sidewalls of the spacers 20 while exposing a small area (e.g., 10 nm or less) of the semiconductor material 16 (active regions for subsequent patterning).

As further shown, exposed portions of the semiconductor material 16 can also be removed using the spacers 20 and remaining material 24 as a mask. This etching process will result in a spacing or slot 26 with a space defined by "x" in the active region. In embodiments, the space "x" between adjacent regions of the substrate 16 is 10 nm or less (e.g., 8 nm), which can provide 11 slices of active region while still effectively maintaining the active region for source/drain efficiency, as described herein. The inset of FIG. 5 shows a top view of the slot 26 (in addition to the spacers 20 and remaining material 24).

In embodiments, the width of the active region (e.g., width of the spacers 20 and material 24) can be about 160 nm with a mandrel pitch of 336 nm. In this scenario, the pitch can be 168 nm (e.g., 160 nm plus 8 nm space), resulting in an active area ratio of 95%. Alternatively, the width of the active region (e.g., width of the spacers 20 and material 24) can be about 33 nm with a mandrel pitch of 85 nm. In this scenario, the pitch can be 41 nm (e.g., 33 nm plus 8 nm space), resulting in an active area ratio of 80%. Accordingly, it is now possible to provide small slots, e.g., 8 nm or even less, while preserving a majority of the active region. As there is a tradeoff between keeping active area and the slotted spacing, the smaller slots are designed to maximize the active area, decrease stress and, hence, increase hole mobility.

Figure 6:
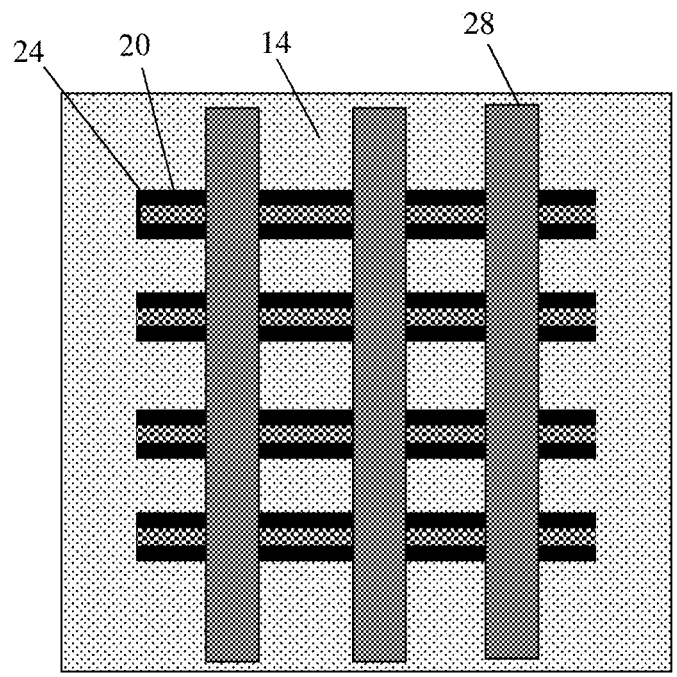
FIG. 6 shows a top view of the structure of FIG. 5.

FIG. 6 shows a top view of the structure shown in FIG. 5, with gate structures 28 in accordance with aspects of the present disclosure. In this embodiment, the edges of the mandrels, e.g., spacer 20 and material 24, can be trimmed prior to or after the gate formation. The trimming can be accomplished using conventional etching processes, e.g., reactive ion implantation. In this configuration, the gate structures 28 can be formed by any appropriate gate fabrication processes, e.g., gate first process or gate last process known to those of skill in the art such that no further explanation is required for a complete understanding of the invention.

Figure 7:
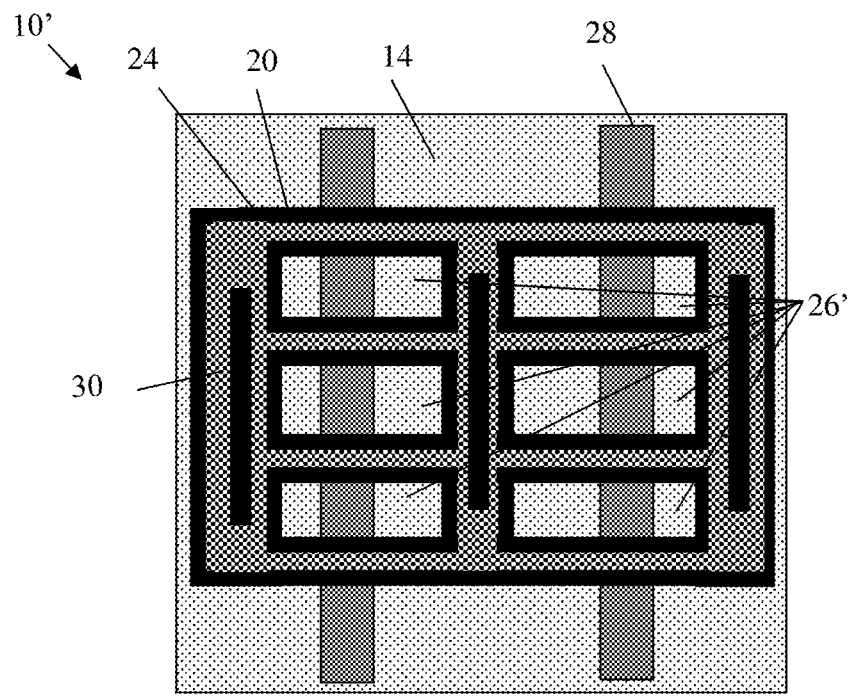
FIG. 7 shows a top view of an alternative structure and respective fabrication processes in accordance with aspects of the present disclosure.

FIG. 7 shows an alternative slotted structure in accordance with aspects of the present disclosure. In the structure 10' of FIG. 7, edges of the material 24 can be kept intact to allow for a contact landing 30 in an active region. In other words, in this embodiment, the edges of the mandrels, e.g., spacer 20 and material 24, are not trimmed. This results in the enclosed slots 26'.

Figure 8:
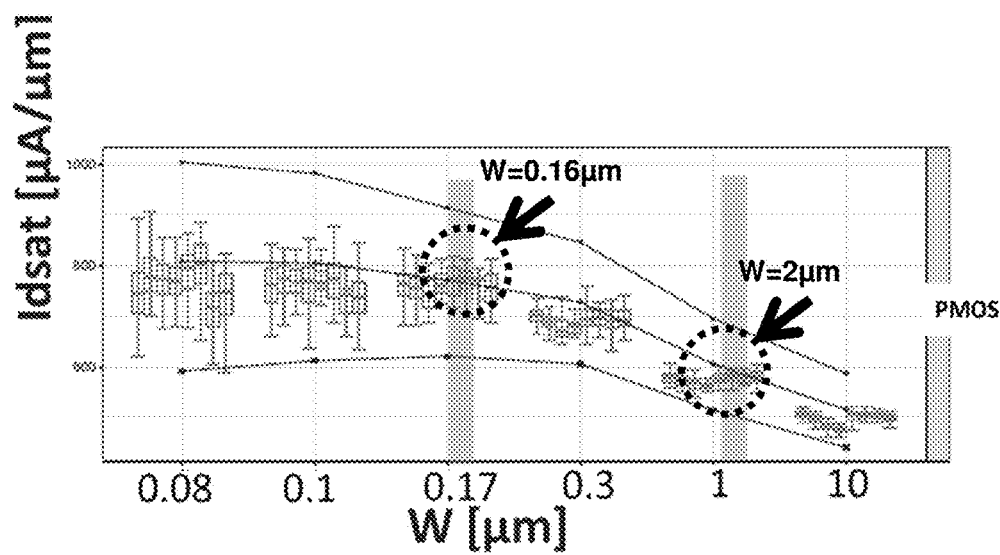
FIG. 8 shows a performance graph for uniaxial stress enhancement.

FIG. 8 shows a performance graph for uniaxial stress enhancement. In the graph of FIG. 8, the x-axis is width measured in microns and the y-axis is Idsat measured in $\mu A/\mu m$. The graph is a log scale. As shown in the graph, there is an approximate increase of 38% between W=2$\mu m$ and W=1.6 $\mu m$ (580 $\mu A/\mu m$ to 800 $\mu A/\mu m$). In addition, there is an approximate increase of Idsat of 21% using slots of approximately 10 nm spacing with a total of 11 slices (W=2 um, 11 slices: W=0.16 $\mu m$+10 nm spacing; (580 uA/um*2 um); (800 uA/um*0.16 um*11), compared to an approximate 12% decrease in Idsat using slots of 80 nm spacing with a total of 8 slices (W=2 um, 8 slices: W=0.16 $\mu m$+80 nm spacing (580 uA/um*2 um); (800 uA/um*0.16 um*8). It is thus shown that the spacing of the slots defined by the present invention will maximize strain, while maintaining effective source/drain efficiency, i.e., achieve higher uniaxial stress, leading to higher drive current.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming a mandrel on top of a diffusion region comprising a diffusion material;
    forming a first material over the mandrel and the diffusion region;
    removing the mandrel to form multiple spacers each having a thickness;
    depositing a second material over the spacers and the diffusion material; and
    forming slots in the diffusion region by removing a portion of the second material over the diffusion region and the underlying diffusion material.

2. The method of claim 1, wherein the diffusion region comprises fully depleted semiconductor on insulator material (FDSOI).

3. The method of claim 1, wherein the removal of the second material over the diffusion region leaves material on the sidewalls of the spacers.

4. The method of claim 1, wherein the first material has an etch selectivity to the mandrel.

5. The method of claim 4, wherein the first material comprises an oxide material and the mandrel comprises a nitride material.

6. The method of claim 1, wherein the second material and the first material are composed of the same material.

7. The method of claim 1, wherein the slots have a spacing of 10 nm or less.

8. The method of claim 1, wherein the diffusion region is an active region.

9. The method of claim 8, wherein the active region has an active area ratio between the active area and the slots of about 80%.

10. The method of claim 8, wherein the active region has an active area ratio between the active area and the slots of about 95%.

11. The method of claim 1, further comprising trimming edges of the spacers and the material.

* * * * *